(12) United States Patent
Jeong et al.

(10) Patent No.: US 8,446,346 B2
(45) Date of Patent: May 21, 2013

(54) ORGANIC LIGHT EMITTING DIODE DISPLAY

(75) Inventors: Hee-Seong Jeong, Yongin (KR);
Sung-Soo Koh, Yongin (KR);
Soon-Ryong Park, Yongin (KR);
Woo-Suk Jung, Yongin (KR);
Chul-Woo Jeong, Yongin (KR);
Jae-Yong Kim, Yongin (KR)

(73) Assignee: Samsung Display Co., Ltd.,
Giheung-Gu, Yongin, Gyeonggi-Do (KR)

( * ) Notice: Subject to any disclaimer, the term of this patent is extended or adjusted under 35 U.S.C. 154(b) by 208 days.

(21) Appl. No.: 12/848,623

(22) Filed: Aug. 2, 2010

(65) Prior Publication Data
US 2011/0122053 A1    May 26, 2011

(30) Foreign Application Priority Data
Nov. 26, 2009 (KR) .................. 10-2009-0115322

(51) Int. Cl.
*G09G 3/30* (2006.01)

(52) U.S. Cl.
USPC .............................. 345/76; 313/506

(58) Field of Classification Search .............. 345/76–84; 313/500–512
See application file for complete search history.

(56) References Cited

U.S. PATENT DOCUMENTS

| | | | |
|---|---|---|---|
| 2004/0217702 A1* | 11/2004 | Garner et al. | 313/512 |
| 2007/0210706 A1* | 9/2007 | Song et al. | 313/506 |
| 2011/0025594 A1* | 2/2011 | Watanabe | 345/102 |
| 2011/0104389 A1* | 5/2011 | Bryan-Brown et al. | 427/510 |
| 2011/0164210 A1* | 7/2011 | Tsuda | 349/96 |

FOREIGN PATENT DOCUMENTS

| | | |
|---|---|---|
| JP | 10-096922 | 4/1998 |
| JP | 11074072 | 3/1999 |
| JP | 2003-133062 A | 5/2003 |
| JP | 2004-349221 A | 12/2004 |
| KR | 10-0638040 | 10/2006 |
| KR | 10-0671646 | 1/2007 |
| KR | 10-2007-0092079 | 9/2007 |
| KR | 1020080090945 A | 10/2008 |
| KR | 10-2009-0021577 | 3/2009 |

* cited by examiner

*Primary Examiner* — Kent Chang
*Assistant Examiner* — Gerald Oliver
(74) *Attorney, Agent, or Firm* — Robert E. Bushnell, Esq.

(57) ABSTRACT

An organic light emitting diode (OLED) display includes: a first substrate; an organic light emitting diode that is positioned on the first substrate and that emits light; a second substrate that is opposite to the first substrate with the organic light emitting diode interposed therebetween; a sealant that is positioned between the first substrate and the second substrate to cohere and seal the first substrate and the second substrate; and a refractive index change portion that is positioned on the second substrate to be opposite to the organic light emitting diode and that has a refractive index that sequentially reduces from the second substrate to the organic light emitting diode.

18 Claims, 13 Drawing Sheets

ORGANIC LIGHT EMITTING DIODE DISPLAY

CLAIM OF PRIORITY

This application makes reference to, incorporates the same herein, and claims all benefits accruing under 35 U.S.C. §119 from an application entitled ORGANIC LIGHT EMITTING DIODE DISPLAY earlier filed in the Korean Intellectual Property Office on Nov. 26, 2009 and there duly assigned Ser. No. 10-2009-0115322.

BACKGROUND OF THE INVENTION

1. Field of the Invention

The present invention relates generally to an organic light emitting diode (OLED) display. More particularly, to an OLED display that reflects light, that is emitted from an organic light emitting diode, more effectively with improved visibility.

2. Description of the Related Art

A display device is a device that displays an image, and currently, an OLED display is in the spotlight.

The OLED display has self luminous characteristics and does not require a separate light source, unlike a liquid crystal display device, and thus can have reduced thickness and weight. Further, the OLED display has high quality characteristics such as low power consumption, high luminance, and a high reaction speed.

In general, several metal wires that are included in the OLED display reflect light that is injected from the outside. When the OLED display is used at a bright place, due to such external light reflection, the OLED display is not good with regard to expression of a black color and contrast, and thus there is a problem that visibility is deteriorated.

Further, because the OLED display includes a plurality of thin films and substrates, due to interference of light by a refractive index difference thereof, there is a problem that a Newton's ring phenomenon, which is a pattern of an undesired concentric circle shape, occurs.

The above information is only for enhancement of understanding of the background of the described technology and therefore it may contain information that does not form the prior art that is already known in this country to a person of ordinary skill in the art.

SUMMARY OF THE INVENTION

The described technology has been made in an effort to provide an OLED display having advantages of suppressing occurrence of a Newton's ring phenomenon while improving visibility.

An exemplary embodiment provides an OLED display including: a first substrate; an organic light emitting diode that is positioned on the first substrate and that emits light; a second substrate that is opposite to the first substrate with the organic light emitting diode interposed therebetween; a sealant that is positioned between the first substrate and the second substrate to cohere and seal the first substrate and the second substrate; and a refractive index change portion that is positioned on the second substrate to be opposite to the organic light emitting diode and that has a refractive index that is sequentially reduced from the second substrate to the organic light emitting diode.

The refractive index change portion may include a moth eye (or motheye) layer that is positioned on the second substrate.

The refractive index change portion may further include an air layer that is formed between the moth eye layer and the organic light emitting diode.

The moth eye layer may have a larger refractive index than that of the air layer.

The moth eye layer may include a plurality of protruding portions that are separated from each other by a uniform gap and that are tapered in a direction of the organic light emitting diode.

The moth eye layer may be formed in the second substrate, and the second substrate and the moth eye layer may be integrally formed.

The OLED display may further include an optical layer that is positioned between the second substrate and the moth eye layer.

The optical layer may include a polarizing film.

The optical layer may include a plurality of color filters that are separated from each other at separation space on the second substrate, and a black matrix that is positioned at the separation space.

The moth eye layer may be formed in the optical layer, and may be integrally formed with the optical layer.

According to the present invention, by suppressing occurrence of a Newton's ring phenomenon while improving visibility, an OLED display in which display quality is improved is provided.

BRIEF DESCRIPTION OF THE DRAWINGS

A more complete appreciation of the present invention, and many of the attendant advantages thereof, will become readily apparent as the same becomes better understood by reference to the following detailed description when considered in conjunction with the accompanying drawings in which like reference symbols indicate the same or similar components, wherein.

DETAILED DESCRIPTION OF THE INVENTION

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

Further, like reference numerals designate like elements in several exemplary embodiments and are representatively described in the first exemplary embodiment and elements different from those of the first exemplary embodiment will be described in other exemplary embodiments.

The drawings and description are to be regarded as illustrative in nature and not restrictive.

Further, the size and thickness of each of elements that are displayed in the drawings are described for better understanding and ease of description, and the present invention is not limited by the described size and thickness.

In the drawings, the thickness of layers, films, panels, regions, etc., are exaggerated for clarity. In the drawings, for better understanding and ease of description, thicknesses of some layers and areas are excessively displayed. When it is said that any part, such as a layer, film, region, or plate, is positioned on another part, it means the part is directly on the other part or above the other part with at least one intermediate part. In contrast, if any part is said to be positioned directly on another part, it means that there is no intermediate part between the two parts.

Further, in the accompanying drawings, an active matrix (AM) OLED display of a 2Tr-1Cap structure having two thin film transistors (TFT) and one capacitor in one pixel is described, but the present invention is not limited thereto. Therefore, the OLED display may have three or more TFTS and two or more capacitors in one pixel, and may have various structures as a separate wire is further formed. Here, a pixel is a minimum unit that displays an image, and the OLED display displays an image through a plurality of pixels.

Hereinafter, an OLED display 101 according to a first exemplary embodiment will be described with reference to FIGS. 1 to 5.

Figure 1:
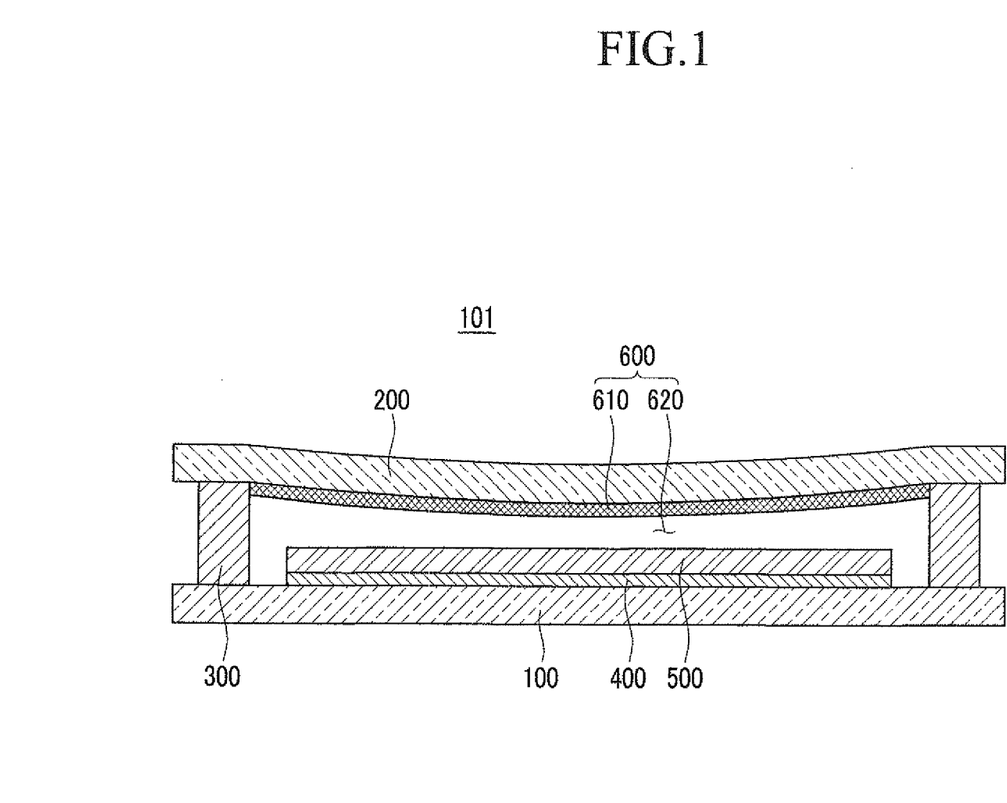
FIG. 1 is a cross-sectional view illustrating an OLED display according to a first exemplary embodiment.

FIG. 1 is a cross-sectional view illustrating an OLED display according to a first exemplary embodiment.

As shown in FIG. 1, the OLED display 101 according to the first exemplary embodiment includes a first substrate 100, a second substrate 200, a sealant 300, a wire portion 400, an organic light emitting diode 500, and a refractive index change portion 600.

The first substrate 100 and the second substrate 200 are insulation substrates including glass, polymer, or stainless steel, and at least one of the first substrate 100 and the second substrate 200 is made of a light transmitting material. The wire portion 400 and the organic light emitting diode 500 are positioned on the first substrate 100, and the second substrate 200 is opposite to the first substrate 100 with the wire portion 400 and the organic light emitting diode 500 interposed therebetween. The first substrate 100 and the second substrate 200 are cohered and sealed by the sealant 300 with the organic light emitting diode 500 interposed therebetween, and the first substrate 100 and the second substrate 200 protect the wire portion 400 and the organic light emitting diode 500 from external interference.

The second substrate 200 includes a central portion corresponding to the organic light emitting diode 500 and an outer edge portion corresponding to the sealant 300. The central portion of the second substrate 200 is bent in a direction of the organic light emitting diode 500 by a differential pressure between outer space and inner space that are formed by the first substrate 100, the second substrate 200, and the sealant 300, and as the central portion of the second substrate 200 is bent in a direction of the organic light emitting diode 500, the outer edge portion of the second substrate 200 is bent with a steeper slope than that of the central portion from a portion that is supported by the sealant 300 to the central portion.

In the outer edge portion of the second substrate 200, a Newton's ring phenomenon occurs due to offsetting, reinforcement, and interference by a plurality of lights such as light that is emitted from the organic light emitting diode 500, light that is radiated from the outside to inner space, and light that is reflected by the first substrate 100, the second substrate 200, and the organic light emitting diode 500, and the Newton's ring phenomenon is minimized by the refractive index change portion 600 to be described later, and a detailed description thereof will be described later together with that of the refractive index change portion 600.

The sealant 300 is positioned between the first substrate 100 and the second substrate 200, and is disposed along the edge of the first substrate 100 and the second substrate 200 to cohere and seal the first substrate 100 and the second substrate 200. The sealant 300 includes frit, etc., and is cured by a curing means such as a laser, etc. The sealant 300 encloses the organic light emitting diode 500 at a predetermined gap from the second substrate 200. A differential pressure of substantially 1 atmosphere is formed between the outer space and the inner space of the OLED display 101 that are formed by the sealant 300, the first substrate 100, and the second substrate 200, and by the differential pressure, the sealant 300 sustains a state that is pressurized by the first substrate 100 and the second substrate 200.

The wire portion 400 includes first and second TFTS 10 and 20 (shown in FIG. 2), and transfers a signal to the organic light emitting diode 500 to drive the organic light emitting diode 500. The organic light emitting diode 500 emits light according to a signal that is received from the wire portion 400.

The organic light emitting diode 500 is positioned on the wire portion 400.

The organic light emitting diode 500 is positioned at a display area on the first substrate 100 and is formed using microelectromechanical systems (MEMS) technology such as photolithography. The organic light emitting diode 500 receives a signal from the wire portion 400 and displays an image by the received signal.

Hereinafter, an internal structure of the OLED display 101 according to the first exemplary embodiment will be described in detail with reference to FIGS. 2 and 3.

Figure 2:
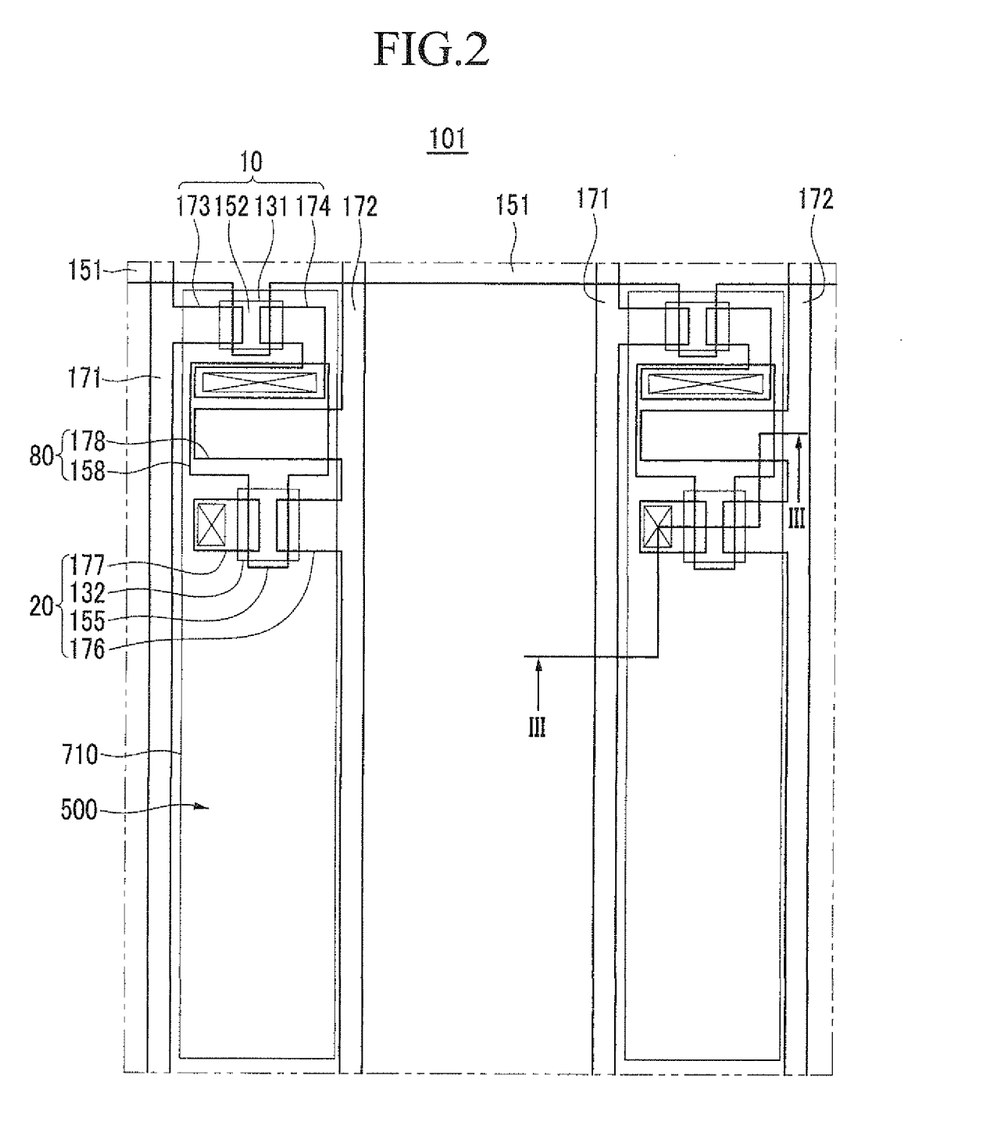
FIG. 2 is a layout view illustrating a structure of a pixel of the OLED display according to the first exemplary embodiment.

FIG. 2 is a layout view illustrating a structure of a pixel of the OLED display according to the first exemplary embodiment. FIG. 3 is a cross-sectional view of the pixel taken along line III-III of FIG. 2.

Figure 3:
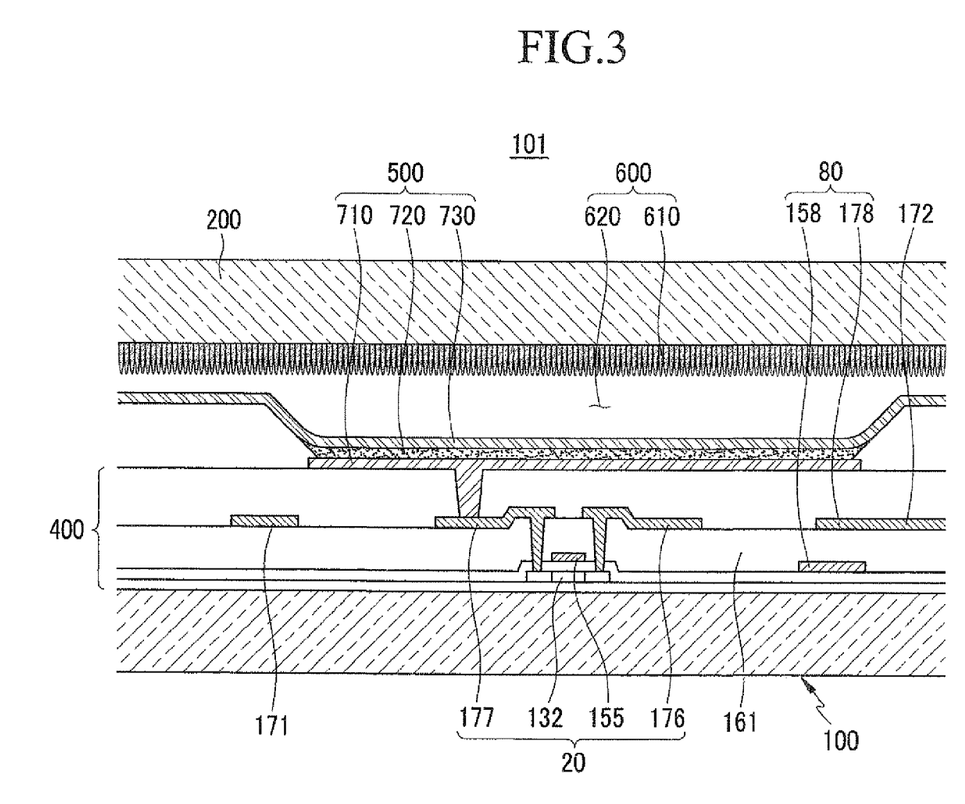
FIG. 3 is a cross-sectional view of the pixel taken along line of FIG. 2.

As shown in FIGS. 2 and 3, the OLED display 101 includes a switching TFT 10, a driving TFT 20, a capacitor 80, and an organic light emitting diode 500 that are each formed in each pixel. Here, a configuration including the switching TFT 10, the driving TFT 20, and the capacitor 80 is referred to as a wire portion 400. The wire portion 400 further includes a gate line 151 that is disposed in one direction of the first substrate 100, and a data line 171 and a common power source line 172 that are insulated from and intersect the gate line 151. Here, a pixel is defined by the gate line 151, the data line 171, and the common power source line 172 as the boundary, but a pixel is not always limited thereto.

The organic light emitting diode 500 includes a first electrode 710, an organic emission layer 720 that is formed on the first electrode 710, and a second electrode 730 that is formed on the organic emission layer 720. Here, the first electrode 710 is an anode, which is a hole injection electrode, and the second electrode 730 is a cathode, which is an electron injection electrode. However, the first exemplary embodiment is not always limited thereto, and the first electrode 710 may become a cathode and the second electrode 730 may become an anode according to a driving method of the OLED display 101. Holes and electrons are injected into the organic emission layer 720 from the first electrode 710 and the second electrode 730, respectively, and when exitons that are formed by coupling of holes and electrons that are injected into the organic emission layer 720 drop from an exited state to a ground state, the organic emission layer 720 emits light. Further, the first electrode 710 of the OLED display 101 according to the first exemplary embodiment is made of a light reflecting material such as aluminum (Al), and the second electrode 730 is made of a light transmitting material including transparent or semitransparent indium tin oxide (ITO) or indium zinc oxide (IZO), but the present invention is not limited thereto, and at least one of the first electrode 710 and the second electrode 730 can be transparent or semitransparent or can be made of a conductive material.

Further, in the OLED display 101 according to the first exemplary embodiment, the organic light emitting diode 500 emits light in a direction of the second substrate 200, but the present invention is not limited thereto, and light that is emitted from the organic light emitting diode 500 can be emitted in a direction of at least one of the first substrate 100 and the second substrate 200. That is, the OLED display 101 according to the first exemplary embodiment is a front light emitting type, but an OLED display according to another exemplary embodiments may be a rear light emitting type or a both side light emitting type.

The capacitor 80 includes a pair of capacitor plates 158 and 178 that are disposed with an interlayer insulating layer 161 interposed therebetween. Here, the interlayer insulating layer 161 is a dielectric material, and the capacity of the capacitor 80 is determined by charges that are stored in the capacitor 80 and a voltage between both capacitor plates 158 and 178.

The switching TFT 10 includes a switching semiconductor layer 131, a switching gate electrode 152, a switching source electrode 173, and a switching drain electrode 174. The driving TFT 20 includes a driving semiconductor layer 132 (having a source region, a channel region and a drain region), a driving gate electrode 155, a driving source electrode 176, and a driving drain electrode 177.

The switching TFT 10 is used as a switch that selects a pixel to emit light. The switching gate electrode 152 is connected to the gate line 151. The switching source electrode 173 is connected to the data line 171. The switching drain electrode 174 is separated from the switching source electrode 173 and is connected to one capacitor plate 158.

The driving TFT 20 applies a driving power source for allowing light emitting of the organic emission layer 720 of the organic light emitting diode 500 within the selected pixel to the first electrode 710. The driving gate electrode 155 is connected to the capacitor plate 158 that is connected to the switching drain electrode 174. The driving source electrode 176 and the other capacitor plate 178 are each connected to the common power source line 172. The driving drain electrode 177 is connected to the first electrode 710 of the organic light emitting diode 500 through a contact hole.

By such a structure, the switching TFT 10 operates by a gate voltage that is applied to the gate line 151 and thus performs a function of transferring a data voltage, that is applied to the data line 171, to the driving TFT 20. A voltage corresponding to a difference between a common voltage, that is applied from the common power source line 172 to the first driving TFT 20, and a data voltage, that is transferred from the switching TFT 10, is stored in the capacitor 80, and a current corresponding to the voltage that is stored in the capacitor 80 flows to the organic light emitting diode 500 through the driving TFT 20, whereby the organic light emitting diode 500 emits light. The refractive index change portion 600 is positioned opposite to the organic light emitting diode 500.

The refractive index change portion 600 is positioned on the second substrate 200 to be opposite to the organic light emitting diode 500. The refractive index change portion 600 has a refractive index that is sequentially reduced from the second substrate 200 to the organic light emitting diode 500. In more detail, the refractive index change portion 600 includes a moth eye layer 610 that is separated from the organic light emitting diode 500 and an air layer 620 that is formed between the moth eye layer 610 and the organic light emitting diode 500, and the refractive index change portion 600 has a refractive index that is sequentially reduced from the second substrate 200 to the organic light emitting diode 500 due to a refractive index difference between the moth eye layer 610 and the air layer 620.

Hereinafter, the refractive index change portion 600 having a refractive index that is sequentially reduced from the second substrate 200 to the organic light emitting diode 500 due to the moth eye layer 610 and the air layer 620 that are included in the refractive index change portion 600 will be described in detail with reference to FIGS. 4, 5(*a*) and 5(*b*).

Figure 4:
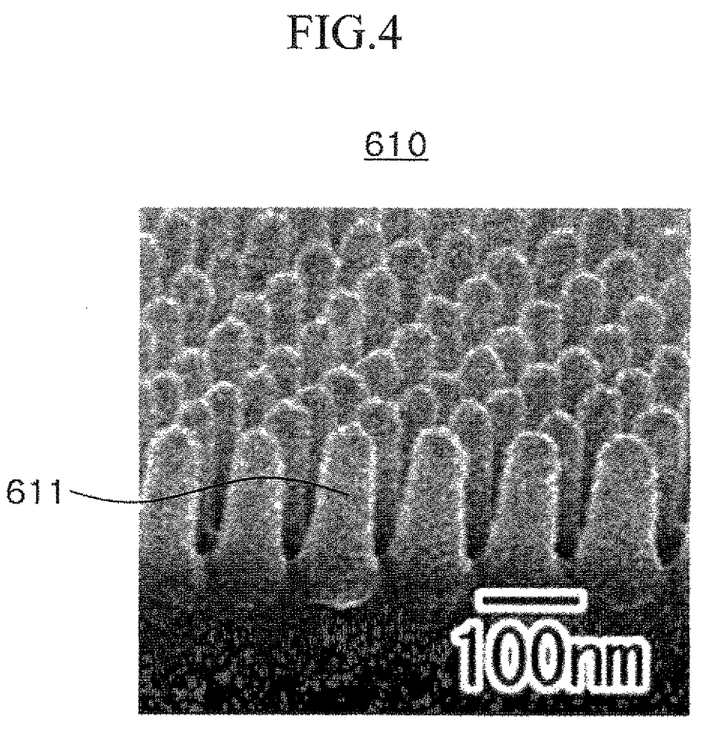
FIG. 4 is a picture illustrating a portion of a moth eye layer that is included in the OLED display according to the first exemplary embodiment.

FIG. 4 is a picture illustrating a portion of a moth eye layer that is included in the OLED display according to the first exemplary embodiment. FIGS. 5(*a*) and 5(*b*) are diagrams illustrating a refractive index change portion that is included in the OLED display according to the first exemplary embodiment.

As shown in FIG. 4, the moth eye layer 610 of the refractive index change portion 600 includes a plurality of protruding portions 611 that are opposite to the organic light emitting diode 500 to protrude in a direction of the organic light emitting diode 500 and that are separated from each other by a uniform gap. The protruding portion 611 is tapered in a direction of the organic light emitting diode 500.

Figure 5:
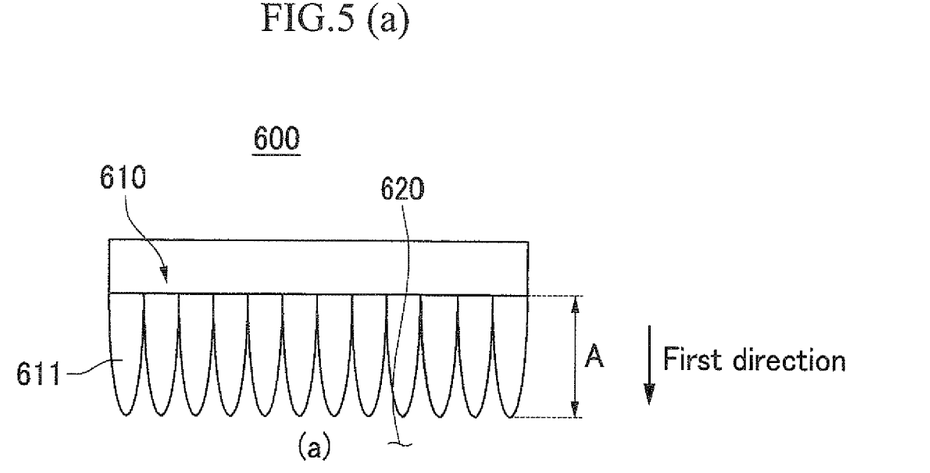
FIGS. 5(a) and 5(b) are diagrams illustrating a refractive index change portion that is included in the OLED display according to the first exemplary embodiment.

As shown in FIG. 5(*a*), the moth eye layer 610 of the refractive index change portion 600 has a refractive index (e.g., a refractive index of 1.1 to 2.5) that is larger than the air layer 620 having a refractive index of 1, and the tapered protruding portion 611 of the moth eye layer 610 is exposed to the air layer 620 that is positioned between the moth eye layer 610 and the organic light emitting diode 500. At a refractive index change area 'A' the protruding portions 611 are positioned separated from each other by a uniform gap and having a larger refractive index than that of the air layer 620 having a refractive index of 1 and enclosing the plurality of protruding portions 611. The protruding portion 611 protrudes in a tapered state toward a first direction in which the organic light emitting diode 500 is positioned, the refractive index sequentially reduces toward the first direction from the refractive index change area A, as shown in FIG. 5(*b*). That is, the refractive index change portion 600 has a refractive index that sequentially reduces from the second substrate 200 to the organic light emitting diode 500.

In this way, as the refractive index change portion 600 has a refractive index that sequentially reduces from the second substrate 200 to the organic light emitting diode 500 due to the protruding portion 611 of the moth eye layer 610 and the air layer 620 that encloses the protruding portion 611, light that is radiated to the refractive index change portion 600 is repeatedly refracted and scattered at an interface of the protruding portion 611 of the moth eye layer 610 and the air layer 620 that encloses the protruding portion 611. That is, as a plurality of lights such as light that is emitted from the organic light emitting diode 500, light that is radiated from the outside to internal space, and light that is reflected by the first substrate 100, the second substrate 200, and the organic light emitting diode 500 are repeatedly refracted and scattered while passing through the refractive index change portion 600 including the moth eye layer 610, occurrence of a Newton's ring phenomenon that may occur by offsetting, reinforcement, and interference of light is minimized in the OLED display 101 according to the first exemplary embodiment.

Particularly, because the moth eye layer 610 of the refractive index change portion 600 is directly opposite to the organic light emitting diode 500, light that is reflected by the organic light emitting diode 500 is first repeatedly refracted and scattered by the refractive index change portion 600 including the moth eye layer 610 and the air layer 620, whereby occurrence of a visibility failure phenomenon by undesired interference of light such as a Newton's ring phenomenon is suppressed.

Further, even if a plurality of metal wires such as the first electrode 710 and the second electrode 720 that are included in the organic light emitting diode 500 reflect light that is injected from the outside, light that is reflected by the organic light emitting diode 500 is repeatedly refracted and scattered while passing through the refractive index change portion 600, whereby deterioration of visibility of a display device due to reflection is suppressed.

An experiment for checking that the OLED display 101 according to the first exemplary embodiment includes the refractive index change portion 600, and thus occurrence of a Newton's ring phenomenon is minimized was performed, and this will be described hereinafter in detail with reference to FIGS. 6 and 7.

Hereinafter, a comparative example and an experimental example will be described with reference to FIGS. 6 and 7.

Figure 6:
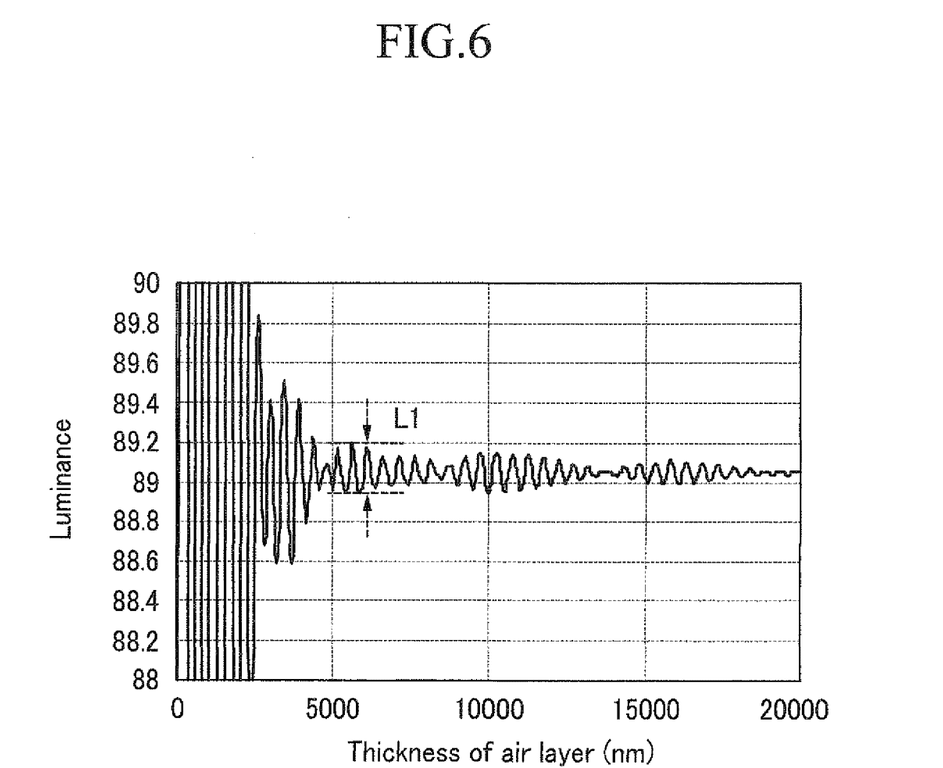
FIG. 6 is a graph illustrating a comparative example of the present invention.

FIG. 6 is a graph illustrating a comparative example of the present invention. FIG. 7 is a graph illustrating an experimental example of the present invention.

Figure 7:
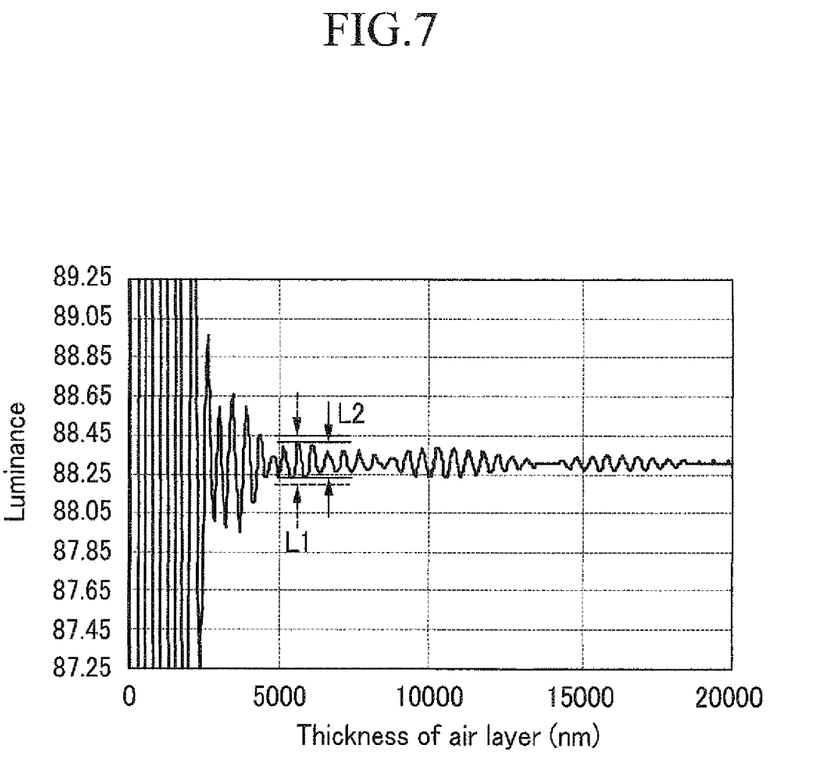
FIG. 7 is a graph illustrating an experimental example of the present invention.

The comparative example that is shown in FIG. 6 does not include the refractive index change portion 600 according to the first exemplary embodiment, and the experimental example that is shown in FIG. 7 includes the refractive index change portion 600 according to the first exemplary embodiment.

FIG. 6 illustrates a comparative example, and is a graph measuring a change of luminance at an air layer 620 that is formed between the first substrate 100 and the second substrate 200, i.e., at different thicknesses between the second substrate 200 and the organic light emitting diode 500.

As shown in FIG. 6, in the comparative example, a length of peak to valley of luminance that is measured when the thickness of the air layer 620 is about 5000 nm is a first length L1.

FIG. 7 is an experimental example, and is a graph measuring a change of luminance at the air layer 620 that is formed between the first substrate 100 and the second substrate 200, i.e., at different thicknesses between the second substrate 200 and the organic light emitting diode 500.

As shown in FIG. 7, in the experimental example, a length of peak to valley of measured luminance when the thickness of the air layer 620 is about 5000 nm is a second length L2 that is smaller than the first length L1 of the comparative example, and the second length L2 that is measured in the experimental example is about 60% of the first length L1 that is measured in the comparative example.

A length of peak to valley of luminance indicates occurrence intensity of a Newton's ring phenomenon, and in such an experiment, the OLED display 101 according to the first exemplary embodiment includes the refractive index change portion 600, whereby occurrence of a Newton's ring phenomenon was minimized, compared with the comparative example that does not include the refractive index change portion 600.

As described above, the OLED display 101 according to the first exemplary embodiment includes the refractive index change portion 600, whereby occurrence of a Newton's ring phenomenon is minimized and deterioration of visibility is suppressed and thus the entire display quality is improved.

Hereinafter, an OLED display 102 according to the second exemplary embodiment will be described with reference to FIG. 8.

Figure 8:
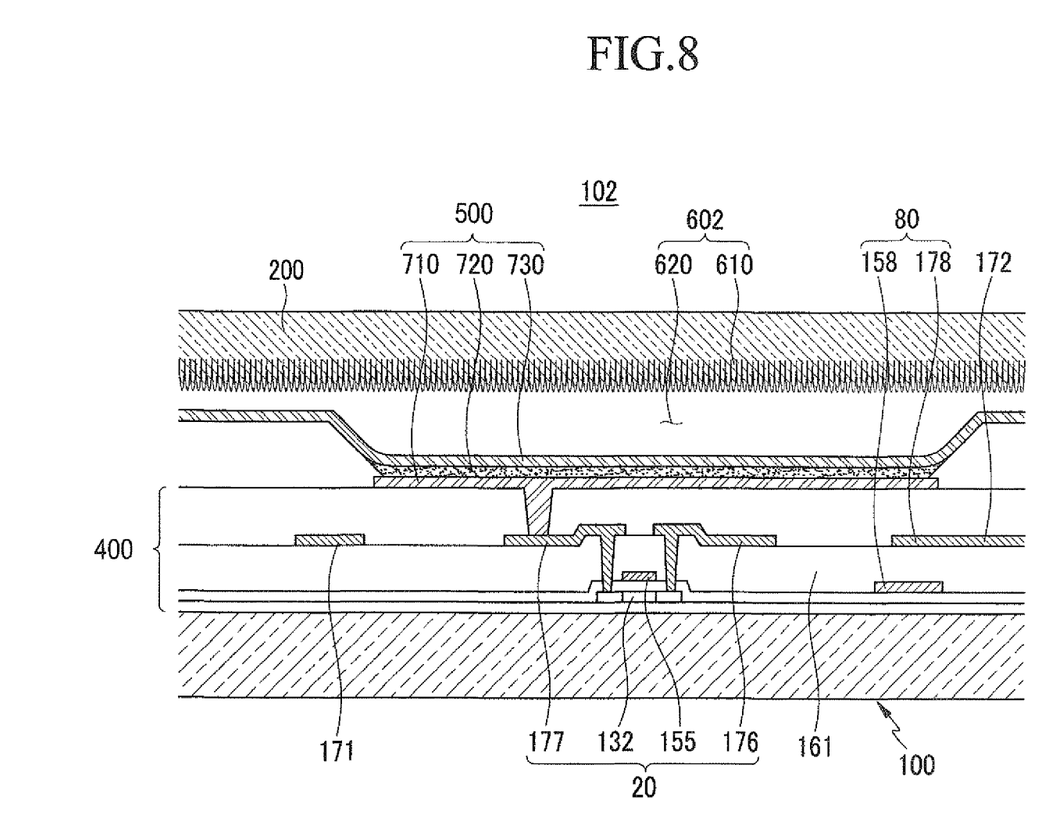
FIG. 8 is a cross-sectional view illustrating a main portion of an OLED display according to a second exemplary embodiment.

FIG. 8 is a cross-sectional view illustrating a main portion of an OLED display according to a second exemplary embodiment.

As shown in FIG. 8, a refractive index change portion 602 according to the second exemplary embodiment includes a moth eye layer 610 and an air layer 620.

The moth eye layer 610 is formed in a surface of a second substrate 200 that is opposite to the organic light emitting diode 500. The moth eye layer 610 is formed in a surface of the second substrate 200 using an MEMS process such as a photolithography process. That is, the moth eye layer 610 is integrally formed with the second substrate 200.

In this way, in the OLED display 102 according to the second exemplary embodiment, as the moth eye layer 610 that is included in the refractive index change portion 602 is formed in the second substrate 200, the second substrate 200 and the moth eye layer 610 are integrally formed, and thus the entire OLED display 102 according to the second exemplary embodiment can be formed in a smaller thickness than that of the OLED display 101 according to the first exemplary embodiment.

Further, the OLED display 102 according to the second exemplary embodiment includes a refractive index change portion 602, whereby occurrence of a Newton's ring phenomenon is minimized and deterioration of visibility is suppressed and thus the entire display quality is improved.

Hereinafter, an OLED display 103 according to a third exemplary embodiment will be described with reference to FIGS. 9 and 10.

Figure 9:
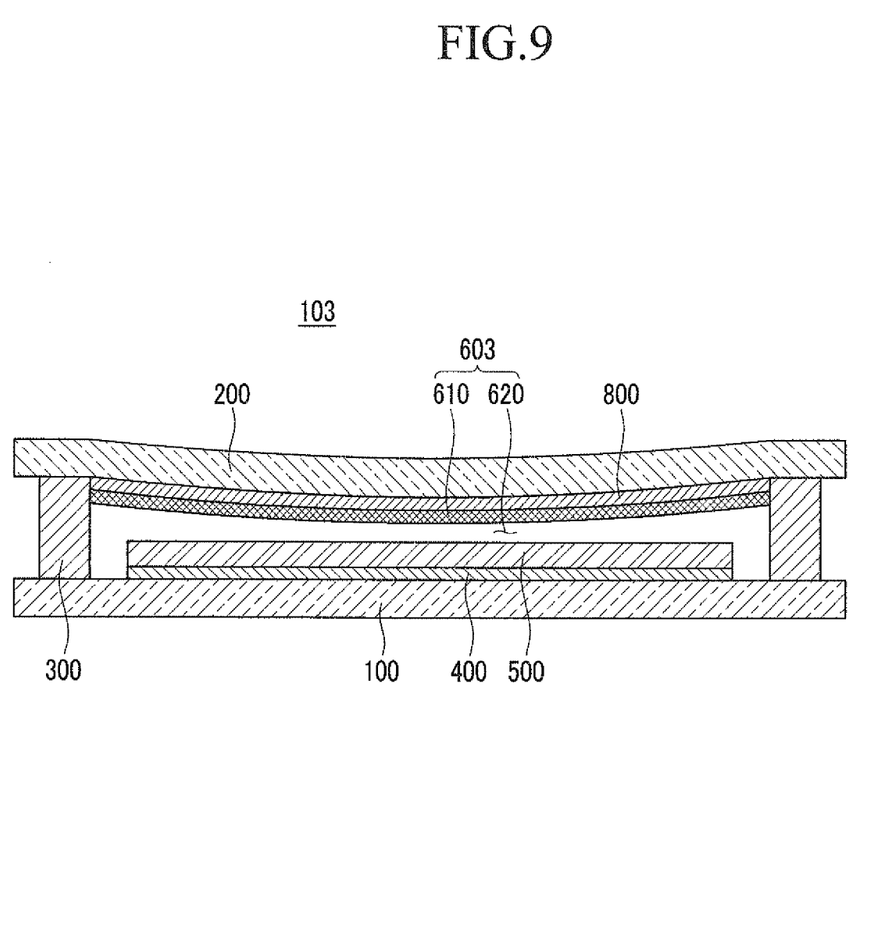
FIG. 9 is a cross-sectional view illustrating an OLED display according to a third exemplary embodiment.

FIG. 9 is a cross-sectional view illustrating an OLED display according to a third exemplary embodiment. FIG. 10 is a cross-sectional view illustrating a main portion of the OLED display according to the third exemplary embodiment.

Figure 10:
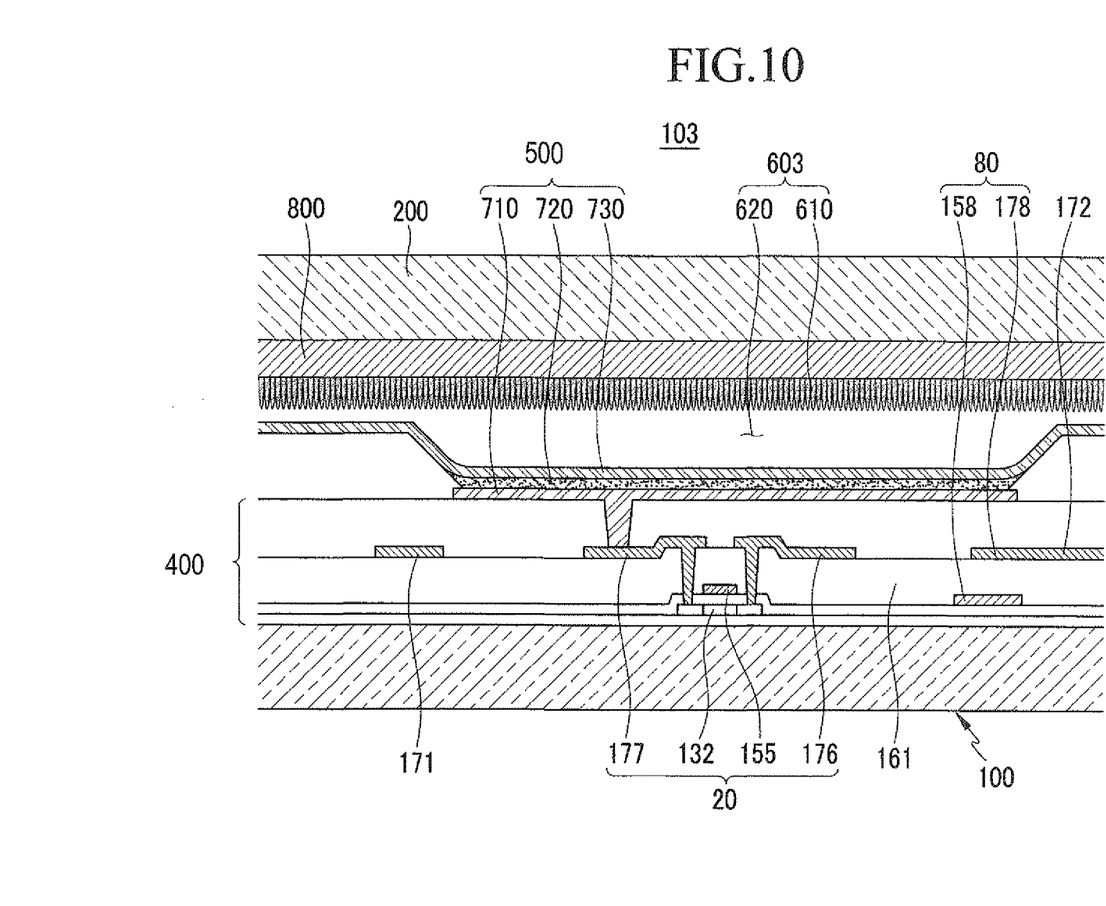
FIG. 10 is a cross-sectional view illustrating a main portion of the OLED display according to the third exemplary embodiment.

As shown in FIGS. 9 and 10, the OLED display 103 according to the third exemplary embodiment includes a first optical layer 800 that is positioned between a second substrate 200 and a refractive index change portion 603 having the moth eye layer 610 and an air layer 620.

The first optical layer 800 includes an optical film, such as a polarizing film and a phase difference film, and as the first optical layer 800 includes an optical film, the first optical layer 800 suppresses external light reflection by light that is radiated from the outside to the inside of the OLED display 103 and that is reflected again to the outside.

In this way, the OLED display 103 according to the third exemplary embodiment includes the first optical layer 800 that is positioned between the refractive index change portion 603 and the second substrate 200, whereby external light reflection is suppressed.

Further, the OLED display 103 according to the third exemplary embodiment includes the refractive index change portion 603, so occurrence of a Newton's ring phenomenon is minimized and deterioration of visibility is suppressed.

That is, the OLED display 103 according to the third exemplary embodiment includes the first optical layer 800 and the refractive index change portion 603, whereby the entire display quality is improved.

In another exemplary embodiment, the first optical layer 800 can be positioned at an external surface of the second substrate 200.

Hereinafter, an OLED display 104 according to the fourth exemplary embodiment will be described with reference to FIG. 11.

Figure 11:
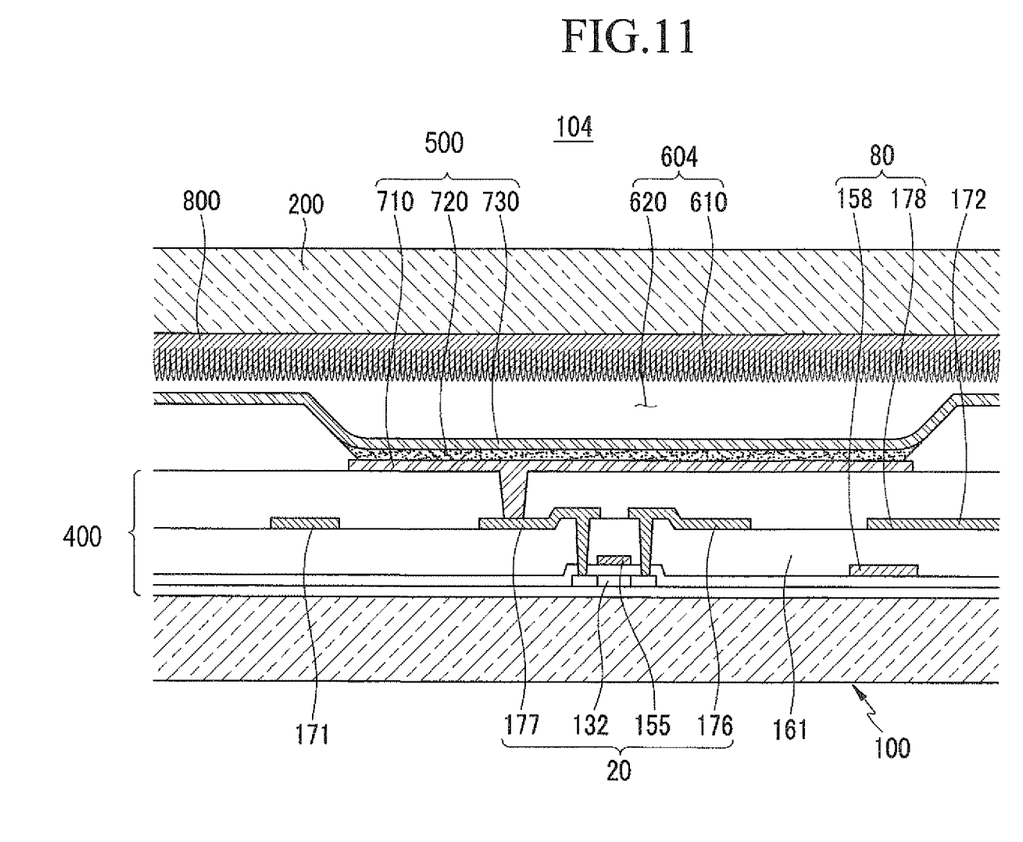
FIG. 11 is a cross-sectional view illustrating a main portion of an OLED display according to a fourth exemplary embodiment.

FIG. 11 is a cross-sectional view illustrating a main portion of an OLED display according to a fourth exemplary embodiment.

As shown in FIG. 11, the OLED display 104 according to the fourth exemplary embodiment includes a first optical layer 800 that is positioned between a second substrate 200 and the organic light emitting diode 500.

The first optical layer 800 includes an optical film such as a polarizing film and a phase difference film, and as the first optical layer 800 includes an optical film, the first optical layer 800 suppresses external light reflection of light that is radiated from the outside to the inside of the OLED display 104 and that is reflected again to the outside.

Further, the moth eye layer 610 is formed in a surface of the first optical layer 800 that is opposite to the organic light emitting diode 500. The moth eye layer 610 is formed in a surface of the first optical layer 800 using an MEMS process such as a photolithography process. That is, the moth eye layer 610 is integrally formed with the first optical layer 800.

In this way, in the OLED display 104 according to the fourth exemplary embodiment, as the moth eye layer 610 that is included in a refractive index change portion 604 is formed in the first optical layer 800, the first optical layer 800 and the moth eye layer 610 are integrally formed, whereby the entire OLED display 104 according to the fourth exemplary embodiment can be formed in a smaller thickness than that of the OLED display 103 of the third exemplary embodiment.

Further, the OLED display 104 according to the fourth exemplary embodiment includes the refractive index change portion 604, whereby occurrence of a Newton's ring phenomenon is minimized and deterioration of visibility is suppressed.

That is, as the OLED display 104 according to the fourth exemplary embodiment includes the first optical layer 800 and the refractive index change portion 604, the entire display quality is improved.

Hereinafter, an OLED display 105 according to a fifth exemplary embodiment will be described with reference to FIG. 12.

Figure 12:
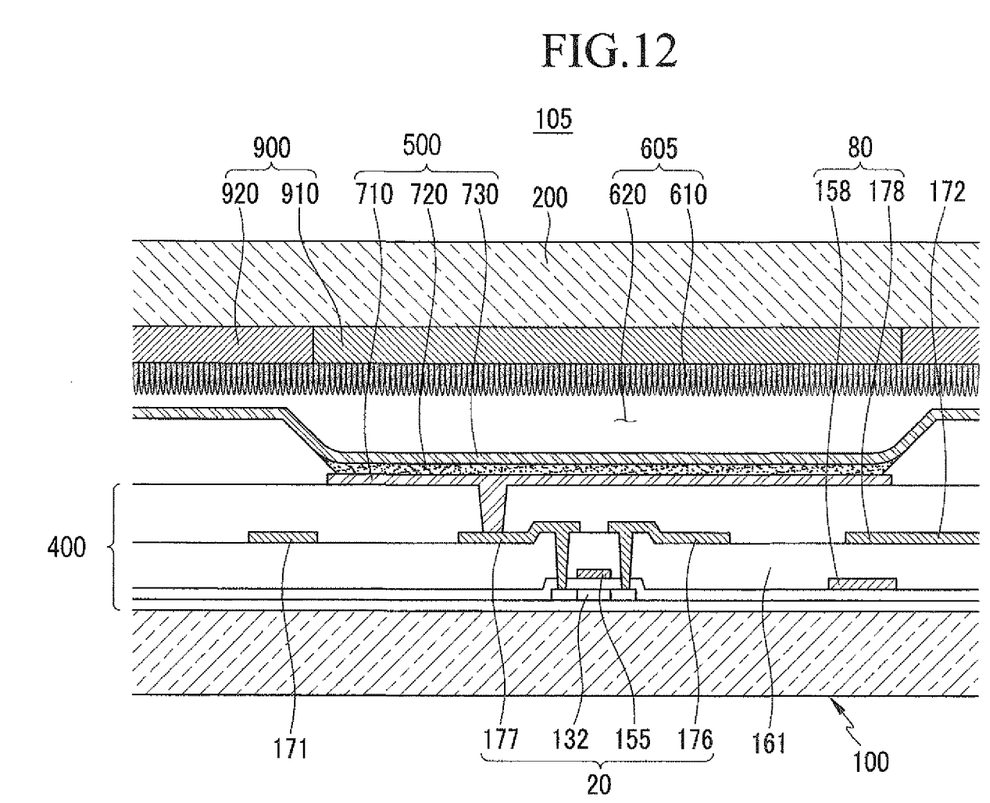
FIG. 12 is a cross-sectional view illustrating a main portion of an OLED display according to a fifth exemplary embodiment.

FIG. 12 is a cross-sectional view illustrating a main portion of the OLED display according to the fifth exemplary embodiment.

As shown in FIG. 12, the OLED display 105 according to the fifth exemplary embodiment includes a second optical layer 900 that is positioned between a second substrate 200 and a refractive index change portion 605 having the moth eye layer 610 and an air layer 620.

The second optical layer 900 includes a plurality of color filters 910 that correspond to each organic emission layer 720 and that are separated from each other with a separation space interposed therebetween on the second substrate 200, and a black matrix 920 that is positioned at separation spaces between the separated color filters 910. The color filter 910 improves a color reproduction rate of light that is emitted from the organic emission layer 720, and the black matrix 920 intercepts a wire of the organic light emitting diode 500 from being viewed from the outside, thereby improving the entire contrast ratio of the OLED display 105.

In this way, the OLED display 105 according to the fifth exemplary embodiment includes the second optical layer 900 having the color filter 910 and the black matrix 920, thereby improving the contrast ratio while improving the color reproduction rate.

Further, the OLED display 105 according to the fifth exemplary embodiment includes the refractive index change portion 605, thereby minimizing occurrence of a Newton's ring phenomenon and suppressing deterioration of visibility.

That is, the OLED display 105 according to the fifth exemplary embodiment includes the second optical layer 900 and the refractive index change portion 605, thereby improving the entire display quality.

In another exemplary embodiment, the second optical layer 900 can be positioned at an external surface of the second substrate 200.

Hereinafter, an OLED display 106 according to a sixth exemplary embodiment will be described with reference to FIG. 13.

Figure 13:
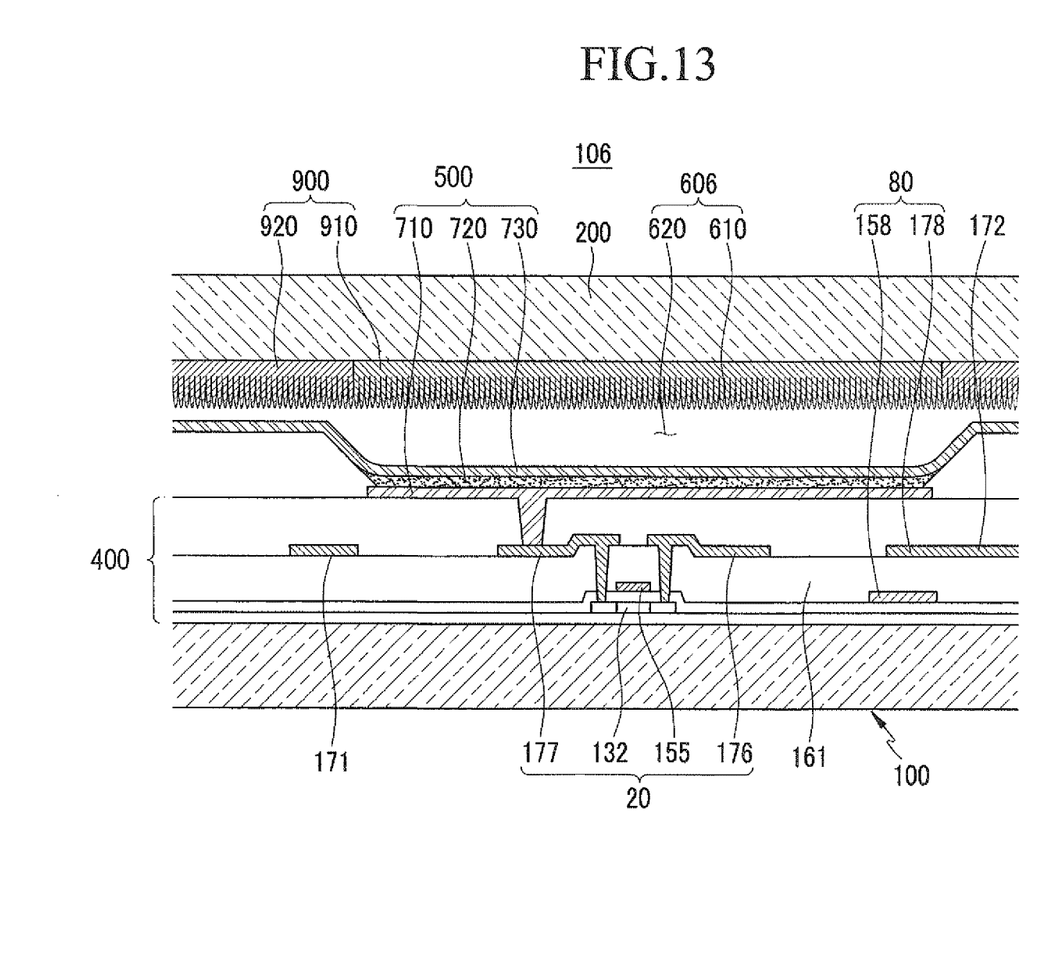
FIG. 13 is a cross-sectional view illustrating a main portion of an OLED display according to a sixth exemplary embodiment.

FIG. 13 is a cross-sectional view illustrating a main portion of the OLED display according to the sixth exemplary embodiment.

As shown in FIG. 13, the OLED display 106 according to the sixth exemplary embodiment includes a second optical layer 900 that is positioned between a second substrate 200 and the organic light emitting diode 500.

The second optical layer 900 includes a plurality of color filters 910 that correspond to each organic emission layer 720 and that are separated from each other with a separation space interposed therebetween on the second substrate 200, and a black matrix 920 that is positioned at the separation spaces between the separated color filters 910. The color filter 910 improves the color reproduction rate of light that is emitted from the organic emission layer 720, and the black matrix 920 intercepts a wire of the organic light emitting diode 500 from being viewed from the outside, thereby improving the entire contrast ratio of the OLED display 106.

Further, the moth eye layer 610 is formed in a surface of the second optical layer 900 that is opposite to the organic light emitting diode 500. The moth eye layer 610 is formed in a surface of the second optical layer 900 using an MEMS process such as a photolithography process. That is, the moth eye layer 610 is integrally formed with the second optical layer 900.

In this way, in the OLED display 106 according to the sixth exemplary embodiment, as the moth eye layer 610 that is included in the refractive index change portion 606 is formed in the second optical layer 900, the second optical layer 900 and the moth eye layer 610 are integrally formed, and thus the entire OLED display 106 according to the sixth exemplary embodiment can be formed in a smaller thickness than that of the OLED display 105 of the fifth exemplary embodiment.

Further, the OLED display 106 according to the sixth exemplary embodiment includes the refractive index change portion 606, whereby occurrence of a Newton's ring phenomenon is minimized and deterioration of visibility is suppressed.

That is, the OLED display 106 according to the sixth exemplary embodiment includes the second optical layer 900 and the refractive index change portion 606, thereby improving the entire display quality.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting diode display comprising:
   a first substrate;
   an organic light emitting diode positioned on the first substrate for emitting light;
   a second substrate opposite to the first substrate, with the organic light emitting diode interposed therebetween;
   a sealant positioned between the first substrate and the second substrate to cohere and seal the first substrate and the second substrate; and
   a refractive index change portion positioned between the second substrate and the organic light emitting diode, the refractive index change portion having a refractive index that sequentially reduces from the second substrate to the organic light emitting diode for repeatedly refracting and scattering light, the refractive index change portion comprising a moth eye layer, the moth eye layer being separated from the organic light emitting diode by an air layer.

2. The organic light emitting diode display as set forth in claim 1, the moth eye layer having a larger refractive index than a refractive index of the air layer.

3. The organic light emitting diode display as set forth in claim 1, the moth eye layer comprising a plurality of protruding portions that are separated from each other by a uniform gap, protruding portions being tapered in a direction of the organic light emitting diode.

4. The organic light emitting diode display as set forth in claim 2, the moth eye layer comprising a plurality of protruding portions that are separated from each other by a uniform gap, protruding portions being tapered in a direction of the organic light emitting diode.

5. The organic light emitting diode display as set forth in claim 1, the moth eye layer being formed on a surface of the second substrate.

6. The organic light emitting diode display as set forth in claim 2, the moth eye layer being formed in a surface of the second substrate.

7. The organic light emitting diode display as set forth in claim 1, further comprising an optical layer that is positioned between the second substrate and the moth eye layer.

8. The organic light emitting diode display as set forth in claim 7, the optical layer comprising a polarizing film.

9. The organic light emitting diode display as set forth in claim 7, the optical layer comprising a plurality of color filters separated from each other by a black matrix, each color filter being positioned over a corresponding organic light emitting diode.

10. The organic light emitting diode display as set forth in claim 7, the moth eye layer being formed in a surface of the optical layer.

11. The organic light emitting diode display as set forth in claim 9, the moth eye layer being integrally formed in the optical layer.

12. An organic light emitting diode display comprising:
    a first substrate;
    a wire layer disposed on the first substrate;
    an organic light emitting diode for emitting light disposed on the wire layer; and
    a second substrate opposite to the first substrate, the second substrate comprising a refractive index change portion having a refractive index that sequentially reduces from the second substrate to the organic light emitting diode for repeatedly refracting and scattering light, the refractive index change portion comprising a moth eye layer, the moth eye layer being separated from the organic light emitting diode by an air layer.

13. The organic light emitting diode display as set forth in claim 12, the moth eye layer having a refractive index that sequentially reduces from the second substrate to the organic light emitting diode.

14. The organic light emitting diode display as set forth in claim 12, the moth eye layer having a larger refractive index than a refractive index of the air layer.

15. The organic light emitting diode display as set forth in claim 12, the moth eye layer comprising a plurality of protruding portions that are separated from each other by a uniform gap, protruding portions being tapered in a direction of the organic light emitting diode.

16. The organic light emitting diode display as set forth in claim 12, the second substrate further comprising an optical layer that is positioned between the second substrate and the refractive index change portion and comprises a polarizing film.

17. The organic light emitting diode display as set forth in claim 16, the optical layer comprising a plurality of color filters separated from each other by a black matrix, each color filter being positioned over a corresponding organic light emitting diode.

18. The organic light emitting diode display as set forth in claim 16, the refractive index change portion being formed in a surface of the optical layer.

* * * * *